United States Patent [19]

Cassat et al.

[11] Patent Number: 4,564,424
[45] Date of Patent: Jan. 14, 1986

[54] METALLIZATION OF ELECTRICALLY INSULATING POLYMERIC FILM SUBSTRATES

[75] Inventors: Robert Cassat, Ternay; Maurice Alliot-Lugaz, Lyons, both of France

[73] Assignee: Rhone-Poulenc Recherches, Courbevoie, France

[21] Appl. No.: 600,833

[22] Filed: Apr. 16, 1984

[30] Foreign Application Priority Data

Apr. 15, 1983 [FR] France .................. 83 06405

[51] Int. Cl.$^4$ .................................................. C25D 5/56
[52] U.S. Cl. ................................ 204/20; 204/30
[58] Field of Search ............ 204/15, 20, 30, 38.4

[56] References Cited

U.S. PATENT DOCUMENTS

| | | | |
|---|---|---|---|
| 3,551,304 | 12/1970 | Letter | 204/30 |
| 3,558,441 | 1/1971 | Chadwick | 204/15 |
| 3,619,382 | 11/1971 | Lupinski | 204/30 |
| 3,767,538 | 10/1973 | Politycki | 204/52 R |

*Primary Examiner*—T. M. Tufariello

*Attorney, Agent, or Firm*—Burns, Doane, Swecker & Mathis

[57] ABSTRACT

Electrically insulating polymeric film substrates are conductively metallized, e.g., to provide base members useful in the fabrication of printed circuits and the like, by (1) shaping into such film substrate an intimate homogeneous admixture of a film-forming polymer matrix having from 10 to 70 percent by total weight of said admixture of finely divided, non-conductive metal oxide particles uniformly distributed therein, (2) disrupting at least one face surface of said shaped film substrate to expose thereon a plurality of said finely divided, non-conductive metal oxide particles, (3) treating said at least one disrupted face surface with a preferably borohydride reducing agent to reduce said exposed metal oxide particles into a layer of electrically conductive free metal, whereby said at least one face surface is rendered electrically conductive, and, advantageously, (4) eletrolytically depositing a reinforcing, electrically conductive metallic overlayer atop said first layer of electrically conductive free metal.

35 Claims, No Drawings

METALLIZATION OF ELECTRICALLY INSULATING POLYMERIC FILM SUBSTRATES

BACKGROUND OF THE INVENTION

1. Field of the Invention

The present invention relates to metallizing the face surfaces of electrically insulating films of synthetic plastics, and also to the intermediate and finished products produced by said metallization. The present invention more especially relates to applying strongly adherent and ductile metallic coatings to flexible polymer films, preferably by electrolytic means, but also by chemical means.

2. Description of the Prior Art

The pace of the development of electronics in everyday life, as well as in industry, is in part reflected in the number of research projects geared to cost reduction and/or miniaturization of printed circuits and the like.

Flexible films have been extensively used both as a supporting substrate for circuitry (printed circuits) and as various other components in a wide variety of electronic systems. Thus, it is required to provide both the face surfaces and thicknesses thereof with well-defined zones of either electrical conductivity or electrical insulation.

While certain rigid substrates such as paper coated with bakelite and then with phenolic or epoxy resins have long been used to fulfil this need, the present trend is in the direction of flexible substrates of film-forming thermoplastic or thermosetting polymers. These polymers are selected as a function of the intended application and the particular properties required, and include, for example:

Poly(ethylene glycol)terephthalate, polypropylene, polyacetals if high temperature strength is not required, fluoride polymers, polyethersulfones, polyetherimides, polyphenylene sulfides, modified polyphenylene oxides, polyarylates, polybenzimidazoles, polyimide/amides, wholly aromatic polyimides or polyamides, if high strength is desired at elevated temperatures, and the like.

Numerous processes are described in the literature for metallizing the face surfaces of plastic films. The processes which entail lamination by various means to apply a metallic foil onto the plastic film and the processes which entail deposition of conductive or insulating coatings by applying to the base substrate a binder matrix which adheres thereto and which contains conductive or insulating inorganic compounds, are reviewed briefly hereinafter:

First, Process P 25 of Philips in *Electronic Production*, page 8, December 1973, is pointedly representative of the prior art. It employs a palladium reduction process.

This process features the sensitization of $TiO_2$ dispersed throughout the volume of the film substrate by light (365 nm radiation) and the reduction of palladium chloride to metallic palladium. It is necessary in a second step to chemically reinforce the metallic surface layer. The process thus has the disadvantages of providing only surface effects and requiring a chemical metallizing step.

Among other processes, that described in U.S. Pat. No. 3,767,538 is also representative. It consists of roughening the surface of a polyester or polyimide film by chemical treatment, of creating conductive palladium nuclei, and of depositing by chemical means or by evaporation a layer of silver, which is subsequently chemically reinforced also. It will thus be seen that such a process is quite lengthy and expensive.

Accordingly, serious need exists in this art for methodology for the fabrication of electronic circuits for industry, the goals of which being:

(i) Substantial reduction in production costs (layout, drilling, stripping, etc.);
(ii) Improvements in the quality of the finished circuits;
(iii) Increased interconnection density; and
(iv) Compliance with the increasingly severe antipollution standards.

It is also required that any such improved methodology provide both rigid and flexible flat circuits and equally metallized holes. A further requirement is good quality of the metallic deposit, e.g., a highly coherent deposit strongly adherent to the support and a ratio of the deposit within the holes to the planar deposit itself being at least as high as 1.

SUMMARY OF THE INVENTION

Accordingly, a major object of the present invention is the provision of an improved process whereby certain well-defined zones of electrically insulating plastic films are rendered conductive, which zones may then be directly structurally reinforced, if necessary employing electrolytic means. Hence, the disadvantages of chemical metallization are obviated, the same being a very slow process characterized by deposition rates on the order of only about one micron per hour and which is entirely unsuitable when metallic layers having a thickness in excess of 20 microns are sought to be produced. In order to obtain such thick coatings, chemical deposition to a thickness on the order of a few microns is typically first carried out, followed by a second deposition employing electrolytic means. The electrolytic method is incomparably more rapid, applying the coating at a rate of deposition on the order of 50 to 100 microns per hour. It will be appreciated, and this is another observation respecting the aforesaid Philips process, that electrolytic metallization cannot be immediately carried out following the stage of substrate activation, in view of the fact that the resulting discontinuous surface of metallic particles obtained is not sufficiently conductive, wherefore it is necessary to employ an intermediate stage of chemical growth in order to obtain the necessary electrical conductivity required for electrolysis.

Another object of this invention is the provision of flexible polymer films capable of being coated, for example, with a layer of copper having a thickness on the order of one micron. This layer is sufficient to render the film electrically conductive. Furthermore, as it is anchored within the film itself, it is very highly adherent thereto. Subsequently, thicker metallic layers may be deposited which are also strongly adherent thereto. Such films may also be made moldable by using thin coatings of a low melting metal.

Briefly, the present invention features the metallization of electrically insulating, flexible films of film-forming polymers, by (i) first preparing a homogeneous admixture of the film-forming polymer and 10 to 70% by weight, with respect to the total weight of the composition, of a finely divided, non-conductive metal oxide, optionally in the presence of a solvent and various adjuvants, (ii) next shaping said admixture into sheet form either by extrusion or casting, (iii) then drawing said sheet or film by a conventional process or otherwise abrading the surface thereof to expose free oxide particles to ambient, (iv) next reducing the metal oxide particles to their free metallic state by treatment with a borohydride to electrically conductivise the face surface areas thereof thus treated, and (v) thence electrolytically reinforcing said conductivised surface areas with a metallic layer.

DETAILED DESCRIPTION OF THE INVENTION

More particularly according to the present invention, using the subject metallized films enables the facile production of printed circuits by the following steps:

(a) First coating the reduced and optionally reinforced conductivised film with a photosensitive resist material;
(b) Developing said photosensitive resist material;
(c) Directly electrolytically reinforcing the resulting film;
(d) Eliminating the developed photosensitive resist material; and
(e) Non-selectively etching away free metal to provide a circuit pattern on said treated film substrate.

By the expression thermoplastic polymer or polymer comprising a thermoplastic phase, there is essentially intended the naturally occurring polymers, such as the celluloses:
(1) Regenerated cellulose;
(2) Ethyl cellulose;
(3) Cellulose acetate;
(4) Cellulose triacetate;
(5) Cellulose acetobutyrate;
(6) Cellulose propionate;
(7) Cellulose nitrate;
(8) Nitrocellulose; or the synthetic polymers, such as the polyolefins:
(1) Polyethylene;
(2) Polypropylene and copolymers thereof;
(3) Polyvinylacetate;
(4) Polybutylene;
(5) Polyisobutylene;
(6) Polyethylene chlorosulfonate;
(7) Polybutene;
(8) Polymethylpentene;
(9) Polyparaxylylene; or the polyvinyl polymers:
(1) Polyvinyl chloride;
(2) Polyvinylidene chloride;
(3) Polyvinyl alcohol;
(4) Polyvinyl butyrate; or the polyacrylic polymers;
(1) Poly(meth)acrylates;
(2) Polyethylene ethyl acrylate;
(3) Polymethylmethacrylate;
(4) Polyacrylonitrile;
(5) Poly(styrene/acrylonitrile); or the polystyrenes:
(1) Polystyrene, poly-α-methylstyrene;
(2) Acrylic-butadiene-styrene or butadiene-styrene copolymers;
or the polyacetals;
or the fluorinated polymers:
(1) Polyethylene propylene fluoride;
(2) Polychlorotrifluoroethylene;
(3) Polytetrafluoroethylene;
(4) Polyparafluoroalkoxy polymers;
(5) Polyvinyl fluoride;
(6) Polyvinylidene fluoride; or the elastomers:
(1) Polyurethanes;
(2) Silicones;
(3) Polychloroprene;
(4) Polyisoprene hydrochloride; or the polyamides:
(1) Nylon 6;
(2) Nylon 66;
(3) Nylon 11;
(4) Nylon 12 and copolyamides thereof; or the polycarbonates; or the saturated polyesters and copolyesters thereof:
(1) Poly(ethylene glycol)terephthalate;
(2) Poly(butylene glycol)terephthalate;
or the modified or unmodified polyphenylene oxides;
or the polysulfones;
or the polyphenylene sulfones or polyphenylene sulfides;
or the various other synthetic polymers, such as the polyhydantoins,
polyparabanic acids or polyethylene oxides.

These polymers may easily be converted into films and membranes by such conventional techniques as extrusion of the molten material or by the casting of solutions thereof. Other methods, such as calendering or sintering, may be used in very special cases.

Non-conducting metal oxides are those metal oxides having no electrical conducting properties. These oxides must be present in the form of very small particles, advantageously having grain size distributions ranging from 0.1 to 5 microns.

The total amount of metal oxide content ranges from 10 to 70% by weight of the total dry solids content of the admixture and preferably ranges from 30 to 50% by weight. It has been found that particularly favorable results are obtained by using cuprous oxide ($Cu_2O$) as the metal oxide.

Additives of the type used in paints may also be added to the composition in order to improve the suspension of the oxide and to stabilize the suspension. Wetting agents, protective colloids, emulsifiers, lubricating agents may also be used, provided that they do not modify the resistivity of the collodions, the molten compositions and the films ultimately obtained.

During the preparation of the collodions, the polymer is initially dissolved in an appropriate solvent until a solution is obtained. Subsequently, the metal oxide is added thereto.

The polymer solution with the metal oxide added is then treated by means similar to those used for the preparation of paints: Rayneri turbines with a high velocity of rotation, successive passages through singular or tricylindrical rod comminutors, for example.

The purpose of such treatment is to finely divide to the maximum possible extent the metal oxide agglomerates and to disperse them in the form of uniform grains.

If extrusion is employed, the mixture is prepared dry by homogenizing to the maximum possible extent, the mixture of the powders, optionally with the aforesaid additives incorporated therein.

Grinding prior to or after mixing may be necessary in order to obtain very fine powders without agglomerates.

The sheet or film is then formed by casting or extrusion by conventional methods.

Subsequently, the drawing or double drawing of the film is effected to impart the necessary mechanical properties thereto. It has been found that this treatment suffices to expose the grains of the metal oxide and to remove any skin that could be covering same, without having to use a surface treatment therefor (sand blasting, abrasive rolls, cutting, chemical treatment or the like).

The film may then be subjected, depending upon the requirements therefor, to a thermal stabilization treatment and/or perforated according to a pre-established pattern, if the film is intended for the manufacture of circuits with holes extending therethrough.

The surface resistivity of the film that may be obtained prior to reinforcement by electrolysis depends not only upon the proportion of the metal oxide therein, but also upon the extent of the reduction treatment. It has also been found that the surface of the film prior to reinforcement by electrolysis advantageously has a surface resistivity ranging from 0.01 $\Omega/\square$ to approximately $10^3 \Omega/\square$.

It too has been determined that the conversion of the cuprous oxide into metallic copper may be effected easily and quantitatively by the action of the borohydrides. This conversion is represented by the reaction:

$$4Cu_2O + BH_4^- \rightarrow 8Cu + B(OH)_3 + OH^-$$

The ease of this reaction is likely due to the catalytic effect of the copper metal, which could be explained by the intermediate formation of unstable copper hydride.

The borohydrides suitable for use in the present invention include both the substituted and unsubstituted borohydrides. Exemplary substituted borohydrides are those wherein a maximum of three hydrogen atoms of the borohydride ion have been replaced by inert substituents, such as, for example, alkyl radicals, aryl radicals, alkoxy radicals, and the like. Preferably, alkaline borohydrides are used, wherein the alkaline moieties comprise the alkali metals sodium or potassium. Exemplary of such compounds are sodium borohydride, potassium borohydride, sodium diethylborohydride, sodium trimethoxyborohydride, potassium triphenylborohydride, and the like.

The reducing step (iv) is effected simply by contacting the film with a solution of the borohydride in water, or in a mixture of water or an inert polar solvent, such as, for example, a lower aliphatic alcohol. Purely aqueous solutions of the borohydride are preferred. The concentrations of these solutions may vary over very wide limits, preferably from 0.05 to 1% by weight of the active hydrogen of the borohydride with respect to the solution. The reducing step (iv) may be carried out at elevated temperature; however, it is preferred to conduct it at a temperature in the vicinity of ambient, for example, at a temperature ranging from 15° C. to 30° C. Concerning the course of this reaction, it should be noted that it produces $B(OH)_3$ and $OH^-$ ions, which have the effect of increasing the pH of the medium during the reaction. At such high pH values, for example, in excess of 13, the reduction is slowed such that it may be advantageous to conduct this operation in a buffered medium to maintain a well-defined degree of reduction. After reduction, the film is rinsed.

At the onset of the reduction, the reaction essentailly involves the cuprous oxide particulates located at the surface of the substrate and which are in direct contact with the reducing agent. Due to the catalytic effect of the copper metal, the reduction reaction then extends into the thickness of the film, especially if the resins comprising same do not have an especially marked hydrophilicity. The magnitude of the oxide reduction may thus be controlled principally and easily by varying the duration of the treatment. In order to obtain a resistivity in keeping with the desired values, the duration of the reduction operation is typically quite short and, depending upon the proportion of oxides comprising the substrate, it usually ranges from about one minute to fifteen minutes. For a given duration of treatment, it is also possible to influence the rate of reduction by adding various accelerators to the medium, such as, for example, boric acid, oxalic acid, citric acid, tartaric acid or metal chlorides, such as cobalt-II chloride, nickel-II chloride, iron-II chloride, manganese-II chloride, copper-II chloride, etc.

Any reduction over the aforesaid period of time entails but a portion of the thickness of the film. It should be noted that for electrical applications, it is important to reduce only a fraction of the thickness of the film, in order to maintain an unreduced, insulating internal portion to prevent the establishmet of conducting bridges. In contrast, if holes are provided, it has been found that a layer of at least the same thickness as that on the surface, is established/reduced on the circumferential surface areas of the holes.

In view of the finely divided state of the copper obtained after the reducing treatment, it would be expected that its oxidation in air would be quite rapid. It has also been found, however, that this is not the case and that the degree of surface resistivity of the film after reduction does not increase even after several days of exposure to ambient air.

It is thus possible to store the reduced film in this state. As a precaution, either an incomplete rinsing may be carried out, leaving trace amounts of the reducing agents on the surface of the film, or a specific reducing agent may be added to the rinsing bath, for example, hydroquinone, or the rinsed and dried film may be protected by coating it with a protective film, for example, of the photosensitive resist material.

The reduced film may subsequently be metallized by deposition of a layer of copper, nickel or another metal thereon. This metallization may be carried out electrochemically, but it has been found, and this is one of the principal advantages of the process according to the present invention, that it may also be directly performed by an electrolytic process. For certain applications it is not unusual to require a metal layer deposition of less than 20 microns and, furthermore, the possibility of directly using an electrolytic process truly contributes to an industrially profitable operation. It will also be appreciated that conventional processing techniques too are within the scope of this invention, whereby the substrate is first subjected to chemical metallization, followed by reinforcement of such initial deposit by a subsequent electrolytic deposition. For a detailed description of operating conditions appropriate for chemical metallization, reference is made to *Encyclopedia of Polymer Science and Technology*, 8, pp. 658-661 (1968). The proportions of the components of the chemical bath, the duration of immersion of the film, the temperature and other operating conditions are determined for each particular case in known manner in order to obtain the best results.

Metallization by electrolysis is of course well known to this art; see, in particular, *Encyclopedia of Polymer Science and Technology*, 8, pp. 661-663 (1968). The suitably reduced film constitutes the cathode and the metal to be deposited, the anode. Both are immersed in an electrolyte through which a current is passed. For example, in the case of the electrolytic coating of copper, the metal deposited may proceed via monovalent or divalent copper originating, for example, from a cyanide electrolyte (monovalent copper) or an electrolyte based upon a sulfate, pyrophosphate or fluoborate (divalent copper). Several adjuvants may be added to the electrolyte: an alkali or alkaline earth metal salt, an acid (acidic copper bath or copper sulfate) or a base (alkaline stannate bath) to increase the conductivity of the electrolyte; a buffer to prevent rapid fluctuations in pH; materials to modify the resultant structure of the electrodepositions, surface active agents, a phenol, a phenol sulfonate, inorganic or organic brightening agents, a levelling agent, such as, for example, coumarin, etc. The quality of the electrodeposit, whether it is a metal or a metal alloy, depends upon the composition of the electrolyte and the physical conditions of electrolysis (temperature, density of the cathodic and anodic current, the anode/cathode distance, surface condition of the electrodes, etc.); the regulation of these different parameters is determined for each particular electrodeposit in known manner.

The fact that it is possible to extend the reduction into the thickness of the film makes it possible to generate the following advantages: during the metallization, a deep anchoring of the metal deposited onto the resin substrate is effected; in the case of welding by addition of a metal forming alloy, the alloy is also capable of migrating into the substrate, because there exists a true continuity of the copper throughout the thickness of the substrate; in the case of a metallization destined to play the role of a heat sink, it is possible to influence the capacity for heat transfer of the resin by the extent of the reduction within the mass of the film.

It is apparent that many modifications can be made to the various embodiments illustrated above, in particular by the substitution of equivalent means, for example, in the nature of the non-precious metal oxide that may be used, without departing from the scope of the present invention. Thus, the cuprous oxide may be replaced by oxides of other non-precious metals, the degree of oxidation of which is selected such as to permit the facile reduction of the oxide with a borohydride and which are capable of forming intermediately unstable metal hydrides. Exemplary such oxides are, for example, nickel-II, cobalt-II, lead-II, cadmium-II, chromium-III, antimony-III, and stannic-IV oxides.

Similarly, the stretching of the film may be eliminated and replaced by other means without exceeding the scope of the invention, if it is desired to employ an unstretched film. An alternative abrading treatment may thus be employed, as above indicated. It has also been found, furthermore, that in certain cases this abrading treatment may itself be eliminated without adverse effect on the subsequent processing steps.

During the electrolytic treatment it is possible to provide metal layers having a thickness on the order of one micron, anchored into the film and being strongly adherent thereto, in contrast to the results obtained by "electroless" deposition. Films comprising such a thin metal coating are of great value in the production of printed circuits, as they permit the elimination of defects and particularly inadequate etching during the subsequent etching treatments. It is thus possible to increase the density of the circuits and to improve their reliability.

It is obvious that it too is possible to provide much thicker metal deposits, on the order of 20 to 50 microns, for example, which are the thicknesses currently used in the production of printed circuits. It is similarly feasible to deposit by melting or by electrolytic means, layers of alloys of the lead/tin type.

The production of printed circuits from the reduced films may then be done by conventional additive processes and the circuitry ultimately inscribed in the electrolytically metallized/reduced films is effected by conventional etching.

Schematically, to obtain circuits with holes drilled into or through the base substrate, two methods may be briefly outlined. The first method, "pattern plating", consists of, beginning with films prepared according to the invention, the drilling of holes in predetermined locations, dust removal, the application of the photosensitive resist material, the development thereof and the reduction of the metal oxide according to the invention. Following rinsing with water a chemical metallization is carried out, the film washed, the developed photosensitive resist material removed, and the film then rinsed and dried.

Several variations on this method may be employed. It is in any event slow due to the chemical metallization stage.

The second method, "panel plating", which is much more important from an industrial standpoint, consists, also beginning with a film prepared according to the invention, of the drilling of holes in predetermined locations, optionally the removal of dust, reducing the metal oxide according to the invention, rinsing with water, the application of the photosensitive resist material, its development, followed by electrolytic metallization. After rinsing, the developed photosensitive resist material is removed and a non-selective etching step is carried out. After rinsing, the film is dried.

This method, which comprises one more step than the preceding method, is actually much more rapid, as electrolytic metallization maybe 100 times more rapid than its chemical counterpart. Furthermore, a great number of variations may be introduced to improve the speed of the process and the quality of the final products obtained therefrom.

The process according to the invention also makes it possible to fabricate metallized films, the metallic overlayers of which being as thin as 1 micron and firmly anchored into the polymer base, as well as themselves being highly coherent and strong. The subject process is distinguished from the processes of the prior art by its simplicity: (i) no sensitizing and activating of the film, and (ii) the capacity to eliminate the delicate operation of abrading the surface to expose the metal oxide included in the substrate. It is also distinguished by its low cost, i.e., no expensive palladium salts or powders of the precious metals are used. Furthermore, the technology is adapted to existing equipment/apparatus. Finally, it permits the fabrication of printed circuits by simple methods, optionally with any number of holes drilled therein or therethrough, under hitherto unattained economic conditions.

The process of the invention is also subject to a wide variety of modifications, as in each stage thereof it is possible to interrupt the process, for example, by intermediate storing of semi-finished product, with the final processing being deferred to a later time.

By varying the nature of the polymer, the amount of metal oxide included in the bulk volume of the film, the treatment following reduction and in particular the nature of the metal electrolytically deposited or chemically, metallized films are obtained that have numerous applications in very many fields, such as, for example, decoration, packaging wherein the properties of the metallic layer, such as gas impermeability, U. V. barrier, availability or weldability, are particularly of interest, and the like. Said metallized films also find use in the optics field, e.g., as reflective surfaces, as well as for sound applications and those associated with the fields of electricity and electronics, wherein the films according to the invention may be used as the base for capacitors, keyboards, circuits, etc., and other applications as well.

In order to further illustrate the present invention and the advantages thereof, the following specific examples are given, it being understood that same are intended only as illustrative and in nowise limitative.

EXAMPLES 1 TO 6

A mixture consisting of 100 parts by weight of a poly(ethylene glycol)terephthalate and 100 parts by weight of particulate cuprous oxide was prepared. The poly(ethylene glycol)terephthalate had an intrinsic viscosity, measured in ortho-chlorophenol at 25° C., of 0.67 and had been ground to a powder having an average grain size distribution ranging from 1 to 2 mm. The cuprous oxide had an average grain size of less than 2 microns.

After roll homogenization the mixture was dried for 17 hours at 160° C. under a vacuum of 2 mm mercury, and then extruded in a piston extruder. Its melting temperature was 285° to 288° C. The filtering means consisted of 350-500 micron metal powder and a downstream, 100 mesh metal screen. The die was 22 mm wide and 0.25 mm thick. The pressure exerted by the piston was approximately 700 bars and the rate of flow through the die was 3 cm³/min. Upon exiting the die the extruded film was dropped onto a receiving roll heated to 88° C. and moving at a linear velocity of from 0.4 to 3.8 m/min. A flexible strip of the polymer was obtained, the dimensions of which depended upon the velocity of the roll.

In this manner, films having the following dimensions were shaped:

| Example | Width (in mm) | Thickness (in mm) |
|---------|---------------|-------------------|
| 1 | 6 | 0.25 |
| 2 | 15 | 0.50 |
| 3 | 18 | 0.60 |

In Example 3, the rate of flow from the die was greater than 3 cm³/min.

The film obtained in Example 2 was stretched transversely in a frame provided with gripping clamps, one of which was mobile, with the entire assembly being placed in a furnace heated to 82° to 88° C.

The following stretched films were obtained:

| Example | Degree of Stretching |
|---------|----------------------|
| 4 | 3.68 |
| 5 | 3.88 |
| 6 | 4.55 |

The degree of stretching is defined as the ratio of the length of the film between the clamps after stretching and its length prior to stretching.

Following stretching, the three specimens were exposed to a heat fixing treatment at constant length, for 5 seconds at 232° C.

Their dimensional stability was thereby improved.

Flat, perfectly planar films free of inhomogeneities were obtained.

EXAMPLES 7 TO 9

By the process employed in the preceding examples, films were prepared from the following different polymers and had a $Cu_2O$ content of 45% by weight.

Example 7: the polymer was nylon 6, a poly(epsilon-caprolactam) having a melting point of 212° C. and a viscosity of 3400 poises at 250° C.

Example 8: the polymer was a copolyamide consisting of 70% by weight epsilon caprolactam and 30% by weight of the amide of hexamethylenediamine and dimeric fatty acids (trademark, Empol 1010).

Example 9: the polymer was a polypropylene marketed by Shell under the trademark, KF 6100.

The three experiments are summarized in the following table:

| Polymer | Extrusion conditions | | | Film obtained (mm) | |
|---------|---------------------|---|---|--------------------|---|
| | Temperature (°C.) | Pressure exerted on piston (bars) | Flow rate from die (cm³/min) | Width | Thickness |
| Example 7 | 275-285 | 630 | 4.5 | 6 | 0.35 |
| Example 8 | 250-260 | 530 | 4.5 | 12 | 0.30 |
| Example 9 | 290 | 530 | 2.6 | 17 | 0.25 |

The resulting films were opaque, flat and free of defects in homogeneity.

EXAMPLES 10 TO 12

In a variant of the process described above, the mixture was comprised of powdered polymer having a grain size distribution of 3 to 4 mm and the particulate cuprous oxide, $Cu_2O$ (in the ratio by weight, 50/50). The powder mixtures were homogenized in a laboratory extruder (Thoret type, having a screw diameter, D, of 20 mm and a length, L, of 20 D).

The following polymers were used: (A) Poly(ethylene glycol)terephthalate (same as in Example 1); and (B) Poly(1,4-butylene glycol)terephthalate.

The conditions of extrusion were as follows:

| Polymer | Preliminary drying | Extrusion temperature (°C.) | Flow rate from die (kg/h) |
|---------|--------------------|-----------------------------|---------------------------|
| A | 17 hours at 160° C. | 285 | 1.0 |
| B | 3 hours at 140° C. and then for 16 hours at 80 ° C. | 255 | 1.2 |

The extruded rods were solidified by cooling and then granulated.

After drying under vacuum for 17 hours at 160° C. for the polymer A and 3 hours at 160° C. for the polymer B, the granules were introduced into the piston extruder described in Example 1.

The operating conditions for the extruder were as follows:

| Example | Polymer | Extrusion temperature (°C.) | Flow rate from die (cm³/min) | Peripheral speed of take-up roll (m/min) |
| --- | --- | --- | --- | --- |
| 10 | A | 285 | 2.5 | 0.9 |
| 11 | A | 280 | 3.5 | 1.0 |
| 12 | B | 250 | 2.3 | 0.9 |

The following films were thus produced, which were pleasing in appearance:

| Example | Width (mm) | Thickness (mm) |
| --- | --- | --- |
| 10 | 12 | 0.22 |
| 11 | 14 | 0.25 |
| 12 | 14 | 0.17 |

EXAMPLE 13

The film of Example 10 was subjected to transverse stretching as described above, at 88° C. and to a stretch ratio of 3.0, then to longitudinal stretching at 105° C. to a stretch ratio of 3, and then to heat fixing treatment at 30° C.

EXAMPLE 14

The film of Example 12 was subjected to transverse stretching as described above, at 82° C. Three stages of stretching were carried out, to draw ratios of 3–3.8 and 4.75.

EXAMPLES 15 AND 16

A Thoret laboratory extruder was used which was equipped with a screw having a diameter, D, of 25 mm and a length, L, of 20 D and with a volumetric gear pump. The extrusion orifice had the transverse dimensions, 100 mm×0.25 mm.

The extruded film was cooled on a rotating drum, the temperature of which was controlled by internal circulation of a cooling fluid. Upon exiting the extruder, the shaped film was wound onto a reel.

Mixtures of poly(butylene glycol)terephthalate (granulometry of 2 to 4 mm) and particulate cuprous oxide were prepared. They were homogenized on rolls. After drying for 3 hours at 140° C., the mixtures were extruded utilizing the apparatus described above.

| Example | Polymer/Cu₂O composition by weight | Extruder outlet temperature | Die temperature | Receiving roll | | |
| --- | --- | --- | --- | --- | --- | --- |
| | | | | Flow rate from die cm³/mn | Temperature | Linear velocity |
| 15 | 50/50 | 240° C. | 238° C. | 42 | 10° C. | 3.1 m/min |
| 16 | 70/30 | 240° C. | 238° C. | 30 | 10° C. | 2.6 m/min |

Under these conditions, films having the following dimensions were obtained:

| Example | Width (mm) | Thickness (mm) |
| --- | --- | --- |
| 15 | 90 | 0.15 |
| 16 | 60 | 0.20 |

The films produced were devoid of surface defects and were pleasing in appearance.

EXAMPLES 17 TO 19

A fraction of the poly(ethylene glycol)terephthalate films prepared in Examples 4 and 6 (uniaxially stretched) and 13 (biaxially stretched) were coated on both face surfaces thereof with an aqueous solution of potassium borohydride.

The composition of the reducing solution was as follows:
 (i) 500 ml Distilled water;
 (ii) 2.5 g Sodium hydroxide in tablet form;
 (iii) 5 g Sodium salt of carboxymethylcellulose (Hercules type 7 MF, "medium viscosity", PM 250,000);
 (iv) 25 g Potassium borohydride; and
 (v) 5 cm³ of wetting agent (1% aqueous solution of Cemulsol DB 311 marketed by S.F.O.S.).

The films were maintained in contact with the reducing solution for 3 minutes, and were then washed with distilled water while wiping the surface of each film with a soft felt cloth.

After drying, the films were copper colored. Resistances, in ohms, between two points spaced 20 cm apart and measured with point electrodes, were as follows:
 Example 17: film from Example 4; 37 to 40 ohms.
 Example 18: film from Example 6; 25 to 30 ohms.
 Example 19: film from Example 13; 9 to 15 ohms.

The reference sample 17 was then placed at the cathode of an electrolytic cell and there maintained under tension by a glass rod fastened to its base. The copper anode consisted of two parts, located on either side of the film. The electrolytic solution contained:
 (i) 20 g/l Copper sulfate ($CuSO_4.5H_2O$);
 (ii) 0.5 ml/l Sulfuric acid, density 1.8; and
 (iii) 5 ml/l of the brightening agent RP 500 marketed by Rhone-Poulenc.

A light electrolytic deposition was conducted for 10 minutes under 0.150 A/dm². After rinsing and drying the copper coated film, the resulting deposition was observed to be uniform, very bright and strongly adherent. The thickness of the deposit was on the order of 2 microns.

It will be appreciated that the reduced film should not be immersed in the acid bath while in unstressed condition; otherwise the surface conductivity produced by the reducing operation will be lost very rapidly.

EXAMPLES 20 TO 23

The films prepared in Examples 3, 7, 8 and 9 were mechanically abraded on the top face surfaces thereof. The abrasive used for such purpose was alumina suspended in water, and the pressure of abrasion was applied using a felt cloth. This operation was for the purpose of exposing the cuprous oxide filler by eliminating the surface skin overcoating same. Pure polymer otherwise constituted the film. Following this surface treatment, the reducing operation was carried out as set forth in Example 17. Uniformly copper coated and conductive films were obtained, with the abrading treatment providing less regular surfaces than in the other cases. This operation, therefore, should be carried out using a more finely divided alumina. It was determined that a strong cooling of the film and carrying out the abrasion operation under dry conditions provided excellent results.

EXAMPLES 24 TO 27

Samples of films prepared in Examples 3, 7 and 9 were mechanically abraded on the top face surfaces thereof, as set forth in Example 20, to provide the films 24, 25 and 26, respectively.

A film sample prepared as in Example 13 was not subjected to such surface abrasion and is designated the film 27.

These films were perforated using a hollow punch to bore holes therein 1.2 mm in diameter. After perforation, these films were reduced as set forth in Example 17 and reinforced, after rinsing, by applying a light electrolytic deposit by the method outlined in Example 17.

The result was a number of uniformly copper coated films which were aesthetically quite pleasing in surface appearance. The wall members of the holes were also uniformly copper coated, and well-defined integral copper junctions were established between the face surface and hole sidewall coatings, thus assuring good electrical continuity therebetween.

EXAMPLES 28 AND 29

The poly(butylene glycol)terephthalate films prepared in Examples 15 and 16 were surface abraded by pressing the films using light pressure against a rotating cylinder covered with a layer of felt cloth wetted with a suspension of alumina in water.

The surface abraded films are designated as the films 28 and 29, respectively.

A sheet of Mylar overlay imprinted with a circuit pattern, including indication of the locations of holes to be bored completely therethrough, was positioned atop each of several samples of films. Assemblies comprising the Mylar overlay, the abraded film sample interlayer, and a base sheet of paper, were then perforated while resting on hard cardboard supports, using a hollow punch.

The two films 28 and 29 thus perforated were next reduced by the process set forth in Example 17 and a light copper deposit was applied thereto from a very weakly acidic electrolytic bath, also as set forth in Example 17, to provide a continuous copper coating over the entire face surfaces of the films, as well as over the sidewalls of the holes.

The copper coated films were then suspended in a laminar flow hood and coated by pulverization with a layer of a positive photosensitive resist material, Maskoat II marketed by Rhone-Poulenc. Following predrying at the ambient temperature, a final drying was carried out for 30 minutes in an oven heated to 90° C.

The films coated with the photoresist were then placed between the face and reverse negatives of the circuit pattern to be imprinted upon each film and each assembly carefully positioned under a 2,000 W ultraviolet lamp and exposed to such radiation for 140 seconds.

The photoresist was developed under agitation, for 3 minutes, in an aqueous solution of the Maskoat 13 developer marketed by Rhone-Poulenc, in a 30% by volume aqueous solution thereof.

The films were then carefully rinsed and mounted at the cathode in an electrolytic copper cell having a soluble double anode. The composition of the electrolytic bath was as follows:

(i) 75 g/l Copper sulfate ($CuSO_4.5H_2O$) marketed by Prolabo;
(ii) 189 g/l Concentrated sulfuric acid, d=1.83; and
(iii) 5 ml/l Additive RP 500 marketed by Rhone-Poulenc.

The electrolysis was carried out for 1 hour using a current density of 3 $A/dm^2$. The films were then rinsed, dried and photoresist eliminated by washing with acetone.

The primary light electrolytic deposit, located under the photoresist after development, was eliminated by immersion for 2 minutes under mild agitation in a 10% aqueous solution of ferric chloride. After rinsing in distilled water, the tarnished copper regained its brilliance by immersion in a 1% aqueous solution of sulfuric acid.

The flexible printed circuits having both front and rear connections were rinsed with distilled water, then with alcohol, and dried.

The zone external of the circuit itself, which served as a conduit for the plating current during electrolysis, was severed. The thickness of the copper coating was approximately 30 microns and the definition of the circuit pattern was excellent.

EXAMPLES 30 AND 31

The films prepared in Examples 10 and 12 were immersed at ambient temperature for 5 minutes in pure morpholine and pure pyridine. They were then rinsed liberally with water. The samples were subsequently reduced as set forth in Example 17. After drying, the films displayed a homogeneous copper color and their surface resistivity, measured between two points spaced approximately 20 cm apart, varied from 10 to 25 ohms.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A process for conductively metallizing an electrically insulating thermoplastic or thermoplastic phase polymeric film substrate, comprising (1) shaping into said film substrate an intimate homogeneous admixture of a film-forming thermoplastic or thermoplastic phase polymer matrix having from 10 to 70 percent by total weight of said admixture of finely divided, non-conductive metal oxide particles uniformly distributed therein, (2) disrupting at least one face surface of said shaped film substrate to expose thereon a plurality of said finely divided, non-conductive metal oxide particles, and (3) treating said at least one disrupted face surface with a reducing agent to reduce said exposed metal oxide particles into a layer of electrically conductive free metal, whereby said at least one face surface is rendered electrically conductive.

2. The process as defined by claim 1, further comprising (4) electrolytically depositing a reinforcing, electrically conductive metallic overlayer atop said first layer of electrically conductive free metal.

3. The process as defined by claim 2, said reducing agent comprising a borohydride.

4. The process as defined by claim 3, said reducing agent comprising a substituted or unsubstituted alkali metal borohydride.

5. The process as defined by claim 3, said film substrate comprising a flexible film-forming polymer.

6. The process as defined by claim 5, said flexible film-forming polymer comprising a polyester, polyamide, polyolefin, polyphenylene oxide, polysulfide, vinyl polymer, (meth)acrylic polymer, polystyrene, fluorinated polymer, polycarbonate, elastomer, polysulfone, polyacetal, parabanic polymer, polyhydantoin, polyalkylene oxide, mixtures or copolymers thereof.

7. The process as defined by claim 3, said finely divided, non-conductive metal oxide particles comprising cuprous oxide.

8. The process as defined by claim 7, said cuprous oxide particles having a grain size distribution ranging from 0.1 to 5 microns.

9. The process as defined by claim 1, said film substrate having a surface resistivity ranging from 0.01 $\Omega/\square$ to $10^3$ $\Omega/\square$ after the step (3).

10. The process as defined by claim 3, wherein said first layer of electrically conductive free metal extends into and is anchored within said shaped film substrate.

11. The process as defined by claim 10, said film-forming polymer matrix having from 30 to 50 percent by total weight of the admixture of said finely divided, non-conductive metal oxide particles uniformly distributed therein.

12. The process as defined by claim 3, said at least one face surface being disrupted by at least uniaxially stretching said shaped film substrate.

13. The process as defined by claim 12, said at least one face surface being disrupted by biaxially stretching said shaped film substrate.

14. The process as defined by claim 3, said at least one face surface being disrupted by surface abrading treatment.

15. The process as defined by claim 1, further comprising heat stabilizing said reduced film substrate.

16. The process as defined by claim 3, further comprising chemically depositing an electrically conductive metallic overlayer on said first layer of electrically conductive free metal prior to said electrolytic deposition step (4).

17. The process as defined by claim 3, the thickness of said first layer of electrically conductive free metal having a thickness on the order of about 1 micron.

18. The process as defined by claim 3, said electrolytically deposited overlayer having a thickness of at least 20 microns.

19. The process as defined by claim 3, said reduction (3) being such as to also reduce unexposed metal oxide particles located within a portion of the volume of said film substrate, but insufficient to conductively alter the electrically insulating characteristic thereof.

20. The process as defined by claim 1, said shaped film substrate having hole(s) bored therein upstream of said reducing step (3), the exposed metal oxide particles on the sidewall surfaces thereof also then being reduced into a layer of electrically conductive free metal at least as thick as said at least one face surface layer of electrically conductive free metal and being physically integral therewith.

21. The process as defined by claim 3, said borohydride reducing agent comprising a liquid solution thereof, the active hydrogen content thereof ranging from 0.05 to 1% by weight.

22. The process as defined by claim 3, a lead/tin alloy electrically conductive overlayer being electrolytically deposited atop said first layer of electrically conductive free metal.

23. The process as defined by claim 7, an electrically conductive copper overlayer being electrolytically deposited atop said first layer of electrically conductive free metal.

24. A process for the fabrication of a printed circuit comprising an electrically insulating thermoplastic or thermoplastic phase polymeric film substrate, which comprises (1) shaping into said film substrate an intimate homogeneous admixture of a film-forming thermoplastic or thermoplastic phase polymer matrix having from 10 to 70 percent by total weight of said admixture of finely divided, non-conductive metal oxide particles uniformly distributed therein, (2) disrupting at least one face surface of said shaped film substrate to expose thereon a plurality of said finely divided, non-conductive metal oxide particles, (3) treating said at least one disrupted face surface with a reducing agent to reduce said exposed metal oxide particles into a layer of electrically conductive free metal, whereby said at least one face surface is rendered electrically conductive, (4) coating said reduced and conductivised film substrate with a photosensitive resist overlayer, (5) imaging a circuit pattern onto said photosensitive resist overlayer and developing unimaged areas thereof, (6) electrolytically depositing a reinforcing, electrically conductive metallic overlayer atop said first layer of electrically conductive free metal, (7) removing photosensitive resist material therefrom, and (8) non-selectively etching said film substrate to define a conductive printed circuit pattern thereof.

25. The process as defined by claim 24, said reducing agent comprising a borohydride.

26. The process as defined by claim 25, said finely divided, non-conductive metal oxide particles comprising cuprous oxide.

27. The process as defined by claim 24, said shaped film substrate having hole(s) bored therein upstream of said reducing step (3), the exposed metal oxide particles on the sidewall surfaces thereof also then being reduced into a layer of electrically conductive free metal at least as thick as said at least one face surface layer of electrically conductive free metal and being physically integral therewith.

28. The process as defined by claim 24, further comprising (3a) electrolytically depositing an initial reinforcing, electrically conductive metallic overlayer atop said first layer of electrically conductive free metal, prior to said step (4).

29. The product of the process as defined by claim 1.

30. The product of the process as defined by claim 3.

31. The product of the process as defined by claim 20.

32. The product of the process as defined by claim 24.

33. The product of the process as defined by claim 27.

34. The product of the process as defined by claim 24, after the step (3) thereof.

35. The product of the process as defined by claim 24, after the step (4) thereof.

* * * * *